(12) United States Patent
Wu

(10) Patent No.: US 7,274,108 B2
(45) Date of Patent: *Sep. 25, 2007

(54) SEMICONDUCTOR CHIP CAPABLE OF IMPLEMENTING WIRE BONDING OVER ACTIVE CIRCUITS

(75) Inventor: Bing-Chang Wu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 60 days.

This patent is subject to a terminal disclaimer.

(21) Appl. No.: 10/904,540

(22) Filed: Nov. 15, 2004

(65) Prior Publication Data

US 2006/0103031 A1    May 18, 2006

(51) Int. Cl.
*H01L 23/48* (2006.01)
*H01L 23/52* (2006.01)
*H01L 29/40* (2006.01)

(52) U.S. Cl. ............... 257/786; 257/784; 257/780; 257/781

(58) Field of Classification Search .......... 257/784, 257/786, 758, 780, 781
See application file for complete search history.

(56) References Cited

U.S. PATENT DOCUMENTS

| | | | | |
|---|---|---|---|---|
| 5,173,671 A | | 12/1992 | Wendler | |
| 5,751,065 A | * | 5/1998 | Chittipeddi et al. | 257/758 |
| 6,022,797 A | * | 2/2000 | Ogasawara et al. | 438/622 |
| 6,297,563 B1 | * | 10/2001 | Yamaha | 257/781 |
| 6,362,528 B2 | * | 3/2002 | Anand | 257/758 |
| 6,414,390 B2 | * | 7/2002 | Nozawa | 257/737 |
| 6,417,575 B2 | * | 7/2002 | Harada et al. | 257/784 |
| 6,476,459 B2 | * | 11/2002 | Lee | 257/503 |
| 6,495,918 B1 | * | 12/2002 | Brintzinger | 257/758 |
| 6,522,021 B2 | * | 2/2003 | Sakihama et al. | 257/784 |
| 6,727,590 B2 | * | 4/2004 | Izumitani et al. | 257/758 |
| 6,897,570 B2 | * | 5/2005 | Nakajima et al. | 257/786 |
| 6,900,541 B1 | * | 5/2005 | Wang et al. | 257/758 |
| 2001/0010408 A1 | * | 8/2001 | Ker et al. | 257/781 |
| 2003/0094634 A1 | * | 5/2003 | Cho et al. | 257/212 |
| 2006/0097406 A1 | * | 5/2006 | Wu et al. | 257/784 |

* cited by examiner

*Primary Examiner*—Douglas W. Owens
*Assistant Examiner*—Tram H Nguyen
(74) *Attorney, Agent, or Firm*—Winston Hsu

(57) ABSTRACT

A semiconductor chip capable of implementing wire bonding over active circuits (BOAC) is provided. The semiconductor chip includes a bonding pad structure, a metal-metal capacitor formed by at least a pair of metal electrodes on the same plane underneath the bonding pad structure, at least an interconnection metal layer, at least a via plug between the interconnection metal layer and the bonding pad structure, and an active circuit situated underneath the bonding pad structure on a semiconductor bottom.

19 Claims, 4 Drawing Sheets

SEMICONDUCTOR CHIP CAPABLE OF IMPLEMENTING WIRE BONDING OVER ACTIVE CIRCUITS

BACKGROUND OF INVENTION

1. Field of the Invention

The present invention relates to the field of semiconductor integrated circuits, and more particularly, to a semiconductor chip capable of implementing wire bonding over active circuits (also referred to as "BOAC") and including capacitors situated beneath a bonding pad structure.

2. Description of the Prior Art

Accompanying progress of semiconductor technology, critical dimensions of integrated circuits are continually shrunk. Therefore, bonding pads which spread around on a chip are obstacles for reducing the chip size. A person skilled in the art understands that active circuits in general are not permitted to be disposed underneath a bonding pad since chip manufacturers and designers agree on the need to avoid damaging integrated circuits disposed underneath a bonding pad with mechanical stress during bonding. Furthermore, the requirements for functional chips and system on a chip (SOC) have increased recently, so how to appropriately disperse mechanical stress acting on a chip during bonding and how to effectively utilize space underneath a bonding pad for implementing wire bonding over active circuits or specific circuits and shrinking a chip size are important for chip manufacturers and designers. For this reason, implementing wire bonding over active circuits is a trend for chip design and manufacturing.

Please refer to FIG. 1. FIG. 1 is a top view of a BOAC integrated circuit structure according to the prior art. A semiconductor chip 10 includes a core area 12 in its central region. A plurality of active devices (not shown) are formed beneath the core area 12. The semiconductor chip 10 further includes a plurality of bonding pads 14 arranged therein. For preventing mechanical stresses from damaging circuits and devices (not shown) beneath the bonding pad 14 during bonding, a portion of specific devices such as a capacitor 16 are disposed between the bonding pad 14 and the core area 12. For solving the disadvantage of the space underneath the bonding pad 14 being unable to be utilized effectively, U.S. Pat. No. 6,476,459 assigned to Korea Samsung Electronics Ltd. discloses an integrated circuit structure including capacitors formed underneath bonding pads. The capacitor structure includes two different potential conductors stacked on different levels and a dielectric located between the two conductors for forming a capacitor for improving the space utilizing underneath bonding pads.

However, U.S. Pat. No. 6,476,459 has disadvantages of the supporting structure being weaker and the manufacturing process being too complex. Therefore, how to utilize same plane conductors to form capacitors and reinforce the supporting structure during bonding is the key point of the present invention.

SUMMARY OF INVENTION

It is therefore a primary objective of the present invention to provide a BOAC integrated circuit structure which includes at least a metal-metal capacitor formed by a pair of same plane metal electrodes and situated underneath a bonding pad structure.

According to the objective of the present invention, a BOAC integrated circuit structure of the present invention includes a bonding pad structure. The bonding pad structure includes a bondable metal pad, a top interconnection metal layer, a stress-buffering dielectric located between the bondable metal pad and the top interconnection metal layer, and at least a first via plug electrically linking the bondable metal pad with the top interconnection metal layer. Moreover, the BOAC integrated circuit structure further includes at least a metal-metal capacitor formed by a pair of same plane metal electrodes and situated underneath the bonding pad structure, at least an interconnection metal layer, at least a second via plug electrically linking the bonding pad structure with the interconnection metal layer, and an active circuit disposed beneath the bonding pad structure on a semiconductor substrate.

According to the objective of the present invention, a plurality of pairs of same plane metal electrodes that are vertically stacked are able to be formed for composing a plurality of metal-metal capacitors.

Since the metal-metal capacitor of the present invention is formed by a pair of same plane metal electrodes, it is able to be formed by one standard copper damascene process for simplifying the manufacturing process. Furthermore, the present invention utilizes a plurality of pairs of same plane metal electrodes vertically stacked to form metal-metal capacitors, so a large number of electric charges are capable of being stored in the metal-metal capacitors of the present invention and the capacitor structure of the present invention is a good reinforcement supporting structure for protecting active circuits situated beneath it.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
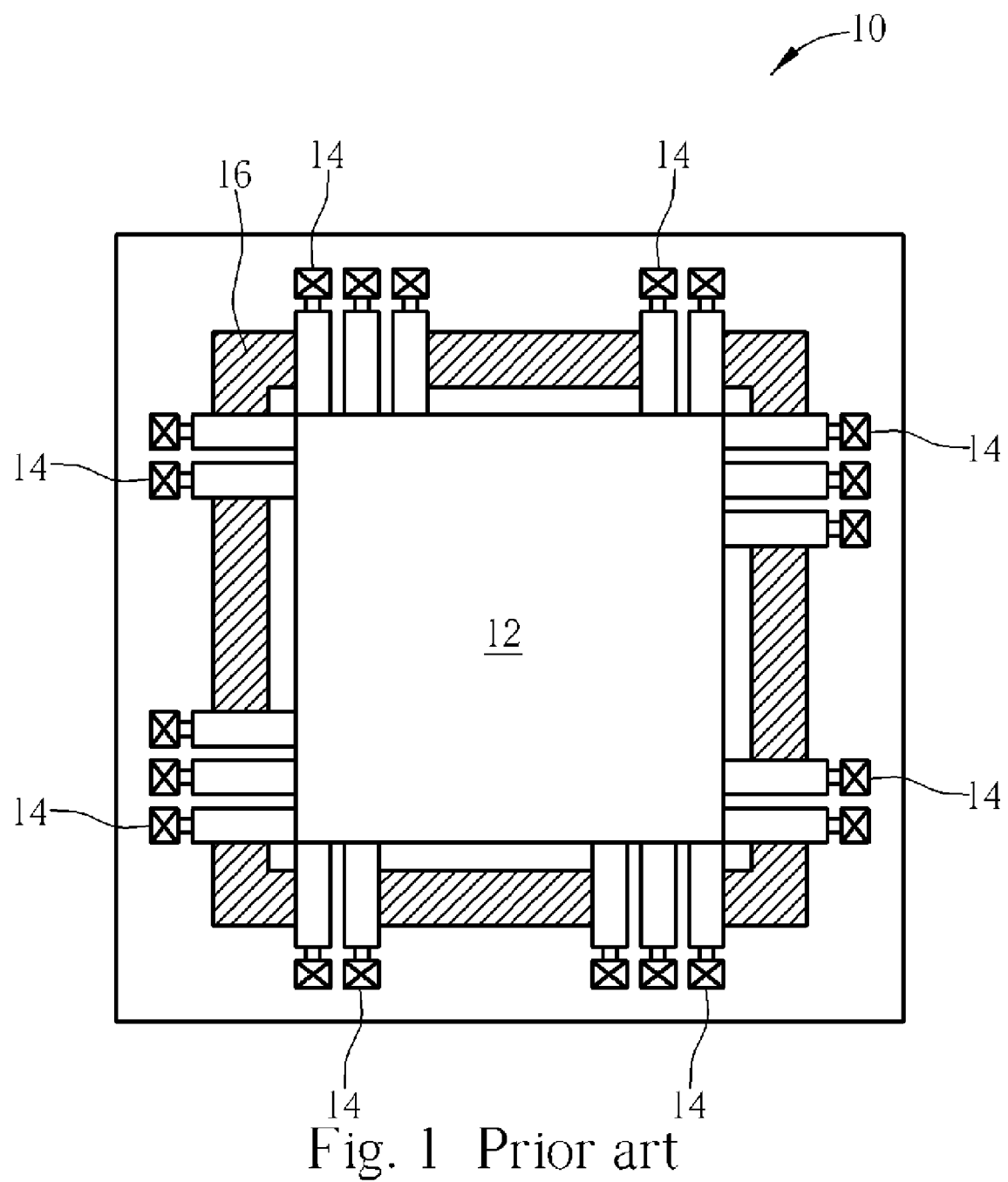
FIG. 1 is a top view of a BOAC integrated circuit structure according to the prior art.
Figure 2:
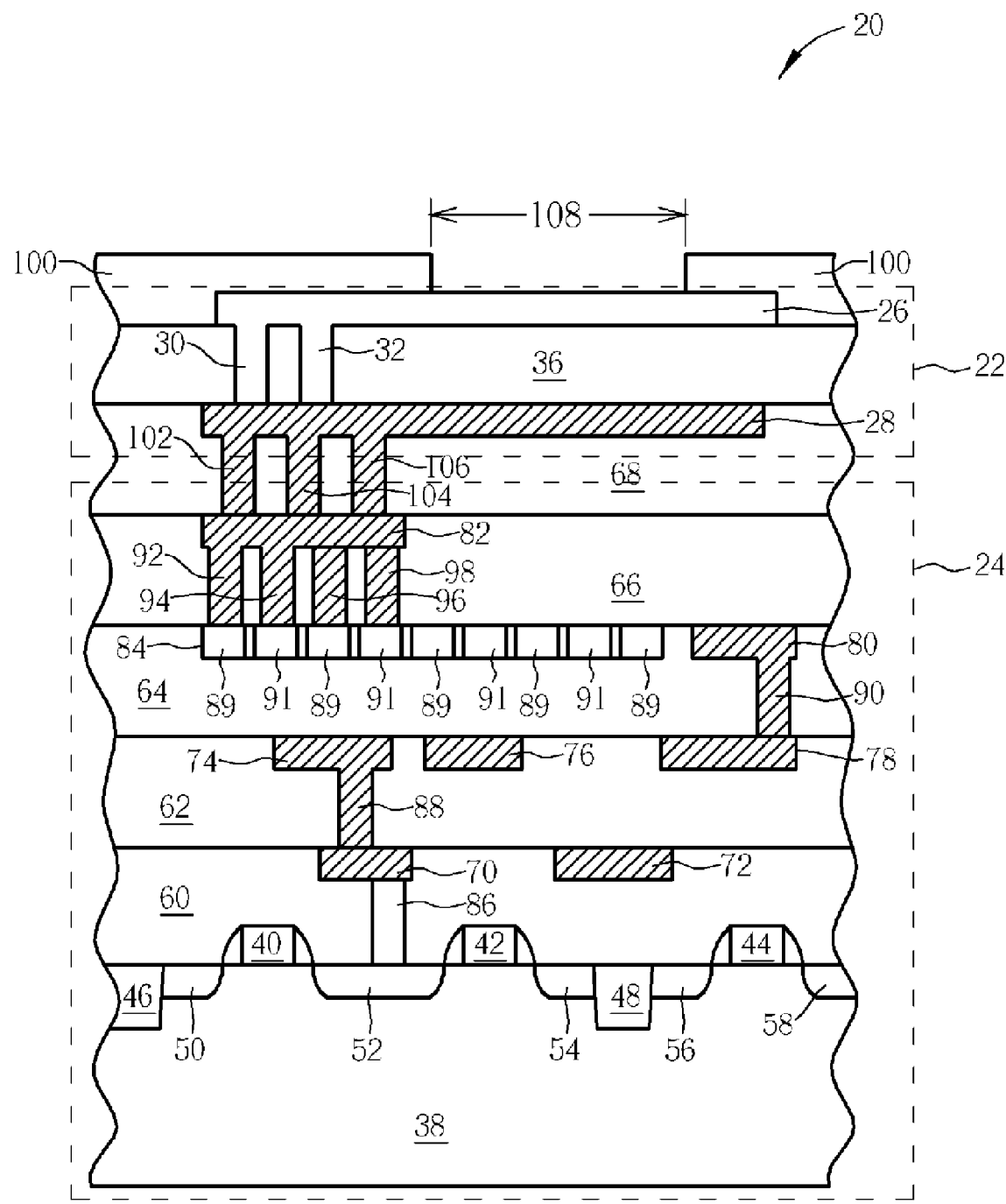
FIG. 2 is a schematic cross-sectional diagram of a BOAC integrated circuit structure according to a first embodiment of the present invention.

Please refer to FIG. 2. FIG. 2 is a schematic cross-sectional diagram of a BOAC integrated circuit structure 20 according to a first embodiment of the present invention. As shown in FIG. 2, a BOAC integrated circuit structure 20 of the present invention includes a bonding pad structure 22 and an active circuit region 24. The bonding pad structure 22, which is a reinforcement structure, includes a bondable metal pad 26, a top interconnection metal layer 28, first via plugs 30 and 32 located beneath the bondable metal pad 26 for electrically linking the bondable metal pad 26 with the top interconnection metal layer 28, and a stress-buffering dielectric 36 located between the bondable metal pad 26 and the top interconnection metal layer 28.

The active circuit region 24 may include input/output (I/O) devices/circuits or electrostatic discharge (ESD) devices/circuits on a semiconductor substrate 38, and include metal-oxide-semiconductor field-effect transistors (MOSFET) 40, 42, and 44, shallow trench isolations (STI)

46 and 48, ion diffusion regions 50, 52, 54, 56, and 58, an inter-layer dielectric (ILD) 60, inter-metal dielectrics (IMD) 62, 64, 66 and 68, interconnection metal layers 70, 72, 74, 76, 78, 80, and 82, and a metal-metal capacitor 84. For the sake of simplicity, an integrated circuit having five levels of metal interconnections is taken as an example and is illustrated in FIG. 2. However, a person skilled in the art will appreciate that the number of metal interconnections should not be limited thereto. For example, the present invention can also be applied in integrated circuits with six, seven, or even higher levels of metal interconnections.

The interconnection metal layers 70 and 72 are defined in the inter-layer dielectric 60 and electrically link with the metal-oxide-semiconductor field-effect transistors (MOSFET) 40, 42, and 44, and the ion diffusion regions 50, 52, 54, 56, and 58 through a contact plug 86. The inter-layer dielectric 60 is silicon oxide (SiO2), fluoride silicate glass (FSG), or other low dielectric constant materials.

According to the first embodiment of the present invention, the top interconnection metal layer 28, the interconnection metal layers 70, 72, 74, 76, 78, 80, and 82 are interconnection copper metal layers and are manufactured by a standard copper damascene process. For example, the interconnection metal layers 74, 76, and 78 are defined in the inter-metal dielectric 62 by a copper damascene process, and a via plug 88, which electrically links the interconnection metal layer 70 with the interconnection metal layer 74, and the interconnection metal layers 74, 76, and 78 are made by a copper damascene process simultaneously in the inter-metal dielectric 62. The inter-metal dielectric 62 is formed by low dielectric constant materials or ultra-low dielectric constant materials. Here, the said ultra-low dielectric constant materials are dielectrics having a dielectric constant less than 2.5, and the structure is usually porous and fragile.

Figure 3:
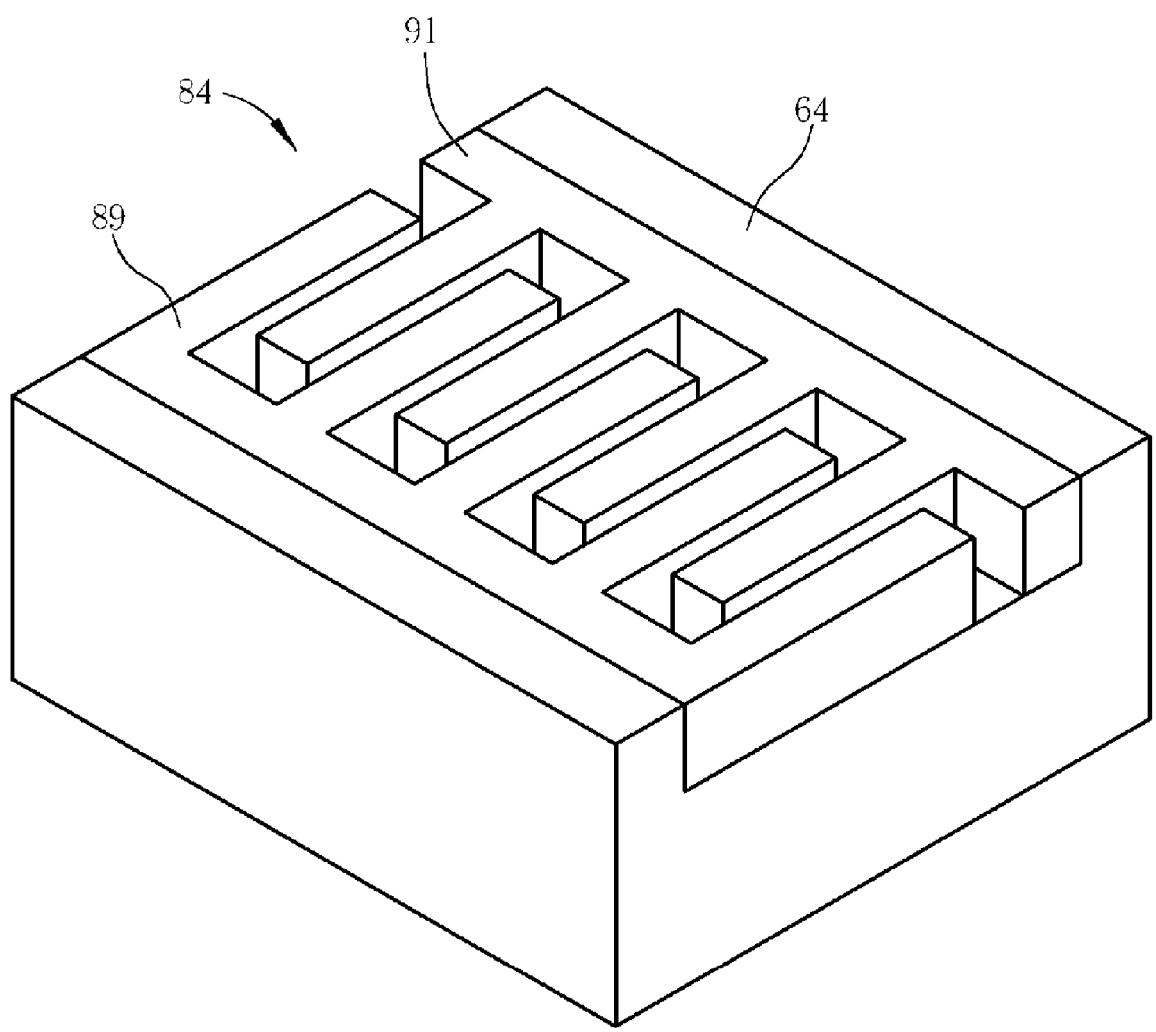
FIG. 3 is a schematic three-dimensional diagram of a metal-metal capacitor of the present invention.

The interconnection metal layers 80 and the metal-metal capacitor 84 are defined in the inter-metal dielectric 64 by a copper damascene process. The metal-metal capacitor 84 is made up of a pair of same plane interlaced comb metal electrodes 89 and 91. For easily understanding the metal-metal capacitor 84 of the present invention, please refer to FIG. 3. FIG. 3 is a schematic three-dimensional diagram of the metal-metal capacitor 84 of the present invention. As shown in FIG. 3, the metal-metal capacitor 84 includes a comb metal cathode 89 and a comb metal anode 91 located in a same plane in the inter-metal dielectric 64, so the metal-metal capacitor 84 is able to be formed by one standard copper damascene process for simplifying the manufacturing process.

Please refer to FIG. 2 again. A via plug 90, which electrically links the interconnection metal layer 78 with the interconnection metal layer 80, is made by a copper damascene process in the inter-metal dielectric 64. The inter-metal dielectric 64 is formed by low dielectric constant materials. The interconnection metal layer 82 is defined in the inter-metal dielectric 66 by a copper damascene process, and via plugs 92, 94, 96 and 98 which electrically link the metal-metal capacitor 84 with the interconnection metal layer 82, are made by a copper damascene process in the inter-metal dielectric 66 simultaneously. The via plugs 92 and 94 electrically link an external cathode (not shown) with the comb metal cathode 89 of the metal-metal capacitor 84, and the via plugs 96 and 98 electrically link an external anode (not shown) with the comb metal anode 91 of the metal-metal capacitor 84. Furthermore, The inter-metal dielectric 66 is formed by low dielectric constant materials.

The top interconnection metal layer 28 is defined in the inter-metal dielectric 68 by a copper damascene process. A plurality of second via plugs 102, 104, and 106, located beneath a section of the bondable metal pad 26 that is covered by a protection layer 100, electrically link the top interconnection metal layer 28 with the interconnection metal layer 82 and are defined in the inter-metal dielectric 68 by a copper damascene process. The inter-metal dielectric 68 is formed by low dielectric constant materials.

The bondable metal pad 26 is covered on the stress-buffering dielectric 36, and the first via plugs 30 and 32 electrically linking the top interconnection metal layer 28 with the bondable metal pad 26 are defined in the stress-buffering dielectric 36. Since the stress-buffering dielectric 36 is made of silicon oxide or other less porous and denser dielectric materials, the stress-buffering dielectric 36 is denser than each inter-metal dielectric and is able to absorb the stress generated during bonding. As above, in the first embodiment of the present invention, the bondable metal pad 26 and the first via plugs 30 and 32 are made of aluminum and are formed by a traditional aluminum wiring process. The protection layer 100 on the top of the BOAC integrated circuit structure 20 is silicon nitride (SiN), polyimide, or other protection materials that have the same utility. The protection layer 100 further includes bonding opening exposing a portion of the top surface of the bondable metal pad 26 to form a bonding window region 108. The metal-metal capacitor 84 is situated underneath the bonding window region 108.

Figure 4:
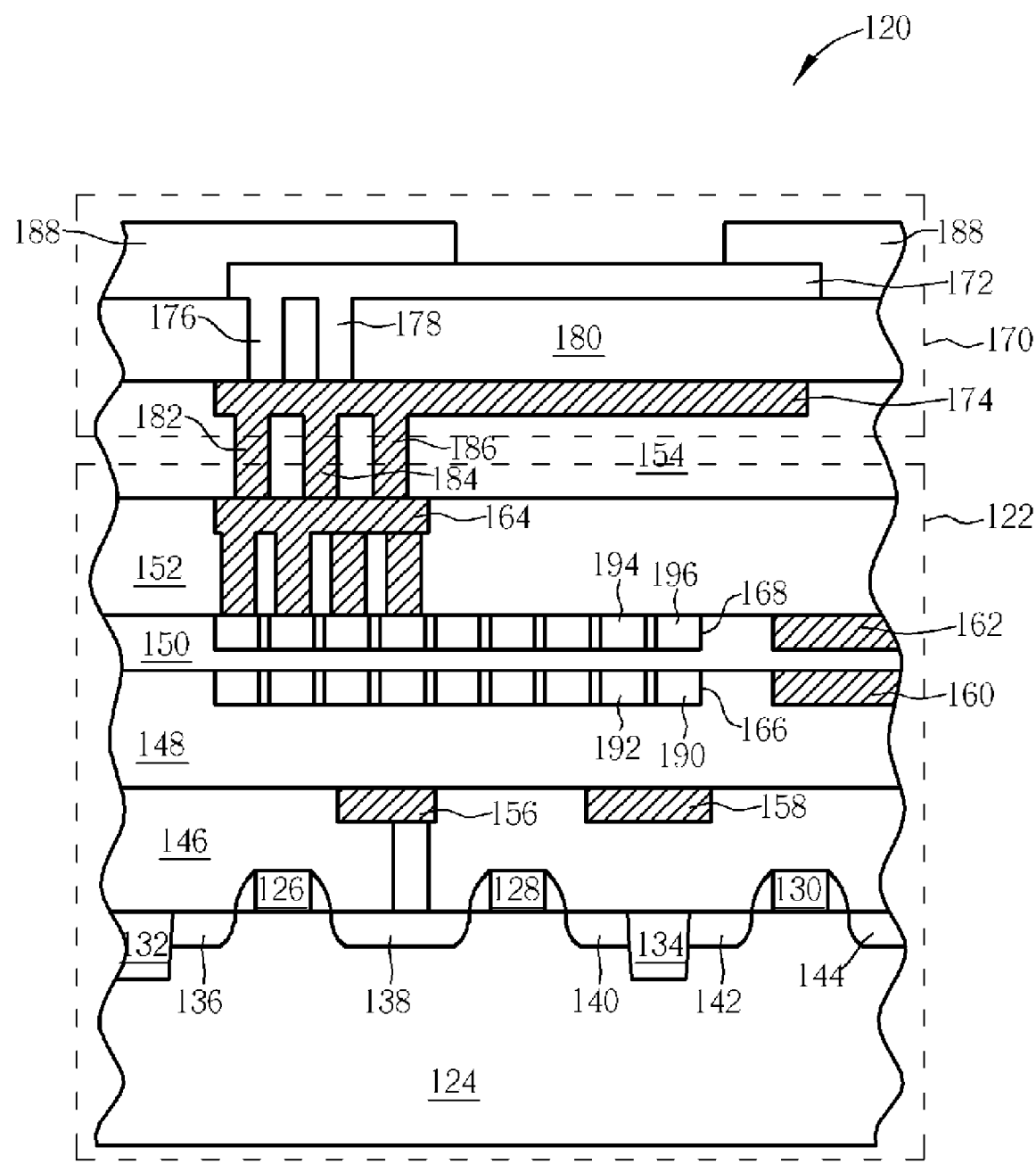
FIG. 4 is a schematic cross-sectional diagram of a BOAC integrated circuit structure according to a second embodiment of the present invention.

Please refer to FIG. 4. FIG. 4 is a schematic cross-sectional diagram of a BOAC integrated circuit structure 120 according to a second embodiment of the present invention. The difference between the first and second embodiments is that a plurality of metal-metal capacitors of the present invention are able to be formed by a plurality of pairs of same plane metal electrodes that are vertically stacked.

As shown in FIG. 4, a BOAC integrated circuit structure 120 of the present invention includes an active circuit region 122 situated on a semiconductor substrate 124, and the active circuit region 122 is made up of metal-oxide-semiconductor field-effect transistors (MOSFET) 126,128, and 130, shallow trench isolations (STI) 132 and 134, ion diffusion regions 136, 138, 140, 142, and 144, an inter-layer dielectric (ILD) 146, inter-metal dielectrics (IMD) 148, 150, 152 and 154, interconnection metal layers 156, 158, 160, 162, 164, and metal-metal capacitors 166 and 168. The BOAC integrated circuit structure 120 further includes a bonding pad structure 170 including a bondable metal pad 172, a top interconnection metal layer 174, first via plugs 176 and 178 located beneath the bondable metal pad 172 for electrically linking the bondable metal pad 172 with the top interconnection metal layer 174, and a stress-buffering dielectric 180 located between the bondable metal pad 172 and the top interconnection metal layer 174. Furthermore, a plurality of second via plugs 182, 184, and 186, located beneath a section of the bondable metal pad 172 that is covered by a protection layer 188, electrically link the top interconnection metal layer 174 with the interconnection metal layer 164.

The metal-metal capacitors 166 and 168 are formed in the inter-metal dielectrics 148 and 150 respectively. The metal-metal capacitor 166 includes a comb metal cathode 190 and a comb metal anode 192, and the metal-metal capacitor 168 includes a comb metal cathode 194 and a comb metal anode 196. The comb metal cathode 194 is stacked above the comb metal anode 192, and similarly the comb metal anode 196 is stacked above the comb metal cathode 190. Therefore, not only do the comb metal cathode 194, the comb metal anode 196, and the inter-metal dielectric 150, and the comb metal cathode 190, the comb metal anode 192, and the inter-metal dielectric 148 form capacitor structures respectively, but also the comb metal cathode 190, the comb metal anode 196, and the inter-metal dielectric 150, and the comb metal cathode 194, the comb metal anode 192, and the inter-metal dielectric 150 form capacitor structures respectively for increasing the capacitor area. Moreover, the BOAC integrated circuit structure of the present invention may further include a metal frame (not shown) made of copper in any inter-metal dielectric between the top interconnection metal layer 174 and the metal-metal capacitor 168 such as the inter-metal dielectric 152. The metal frame serves as a reinforcement supporting structure. During bonding, a part of the mechanical stress exerted on the bondable metal pad 172 is absorbed by the stress-buffering dielectric 180 and is offset by the metal frame.

In comparison with the prior art, the BOAC integrated circuit structure of the present invention includes the following advantages:

1. The metal-metal capacitor of the present invention is disposed beneath the bondable metal pad, hence the wiring area will be diminished and the chip size will be shrunk.

2. The metal-metal capacitor of the present invention is formed by a pair of same plane metal electrodes, hence it is able to be formed by one standard copper damascene process for simplifying the manufacturing process.

3. The present invention utilizes a plurality of pairs of same plane metal electrodes vertically stacked to form metal-metal capacitors, hence a large number of electric charges are capable of being stored in the metal-metal capacitors of the present invention.

4. The capacitor structure of the present invention is a good reinforcement supporting structure for protecting active circuits situated beneath it.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip capable of implementing wire bonding over active circuits, comprising:
   a bonding pad structure;
   at least a metal-metal capacitor situated beneath the bonding pad structure and the metal-metal capacitor comprising at least a pair of same plane metal electrodes in a same lamination; and
   an active circuit situated beneath the bonding pad structure and on a semiconductor substrate.

2. The semiconductor chip of claim 1 further comprising at least an interconnection metal layer situated beneath the bonding pad structure.

3. The semiconductor chip of claim 2 further comprising at least a first via plug situated beneath the bonding pad structure for electrically linking the bonding pad structure and the interconnection metal layer.

4. The semiconductor chip of claim 3, wherein the interconnection metal layer, the first via plug, and the metal-metal capacitor are damascened by copper.

5. The semiconductor chip of claim 1, wherein the bonding pad structure comprises:
   a bondable metal pad;
   a top interconnection metal layer;
   a stress-buffering dielectric located between the bondable metal pad and the top interconnection metal layer; and
   at least a second via plug situated in the stress-buffering dielectric beneath the bondable metal pad for electrically linking the bondable metal pad and the top interconnection metal layer.

6. The semiconductor chip of claim 5 further comprising a protection layer covering the stress-buffering dielectric and a portion of the bondable metal pad.

7. The semiconductor chip of claim 6, wherein the protection layer comprises a bonding opening exposing a portion of the top surface of the bondable metal pad to form a bonding window region.

8. The semiconductor chip of claim 7, wherein the metal-metal capacitor is situated beneath the bonding window region.

9. The semiconductor chip of claim 6, wherein the protection layer is silicon nitride (SiN).

10. The semiconductor chip of claim 6, wherein the protection layer is polyimide.

11. The semiconductor chip of claim 5, wherein the stress-buffering dielectric is silicon oxide (SiO2).

12. The semiconductor chip of claim 5, wherein the bondable metal pad is an aluminum metal pad.

13. The semiconductor chip of claim 5, wherein the second via plug is an aluminum plug.

14. The semiconductor chip of claim 5 further comprising a metal frame damascened in an inter-metal dielectric (IMD) beneath the top interconnection metal layer for serving as a reinforcement supporting structure.

15. The semiconductor chip of claim 14, wherein the stress-buffering dielectric is used to absorb stresses produced while bonding, and the stresses are offset by the metal frame.

16. The semiconductor chip of claim 14, wherein the stress-buffering dielectric is denser than the inter-metal dielectric.

17. The semiconductor chip of claim 14, wherein the top interconnection metal layer, and the metal frame are damascened by copper.

18. The semiconductor chip of claim 1, wherein the pair of same plane metal electrodes is two interlaced comb electrodes.

19. The semiconductor chip of claim 1, wherein the metal-metal capacitor comprises a plurality of pairs of same plane metal electrodes that are vertically stacked.

* * * * *